(12) United States Patent
Hsu et al.

(10) Patent No.: US 11,424,216 B2
(45) Date of Patent: Aug. 23, 2022

(54) ELECTRONIC DEVICE BONDING STRUCTURE AND FABRICATION METHOD THEREOF

(71) Applicant: Unimicron Technology Corp., Taoyuan (TW)

(72) Inventors: Chia-Fu Hsu, Taichung (TW); Kai-Ming Yang, Hsinchu County (TW); Pu-Ju Lin, Hsinchu (TW); Cheng-Ta Ko, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/030,380

(22) Filed: Sep. 24, 2020

(65) Prior Publication Data

US 2022/0068872 A1 Mar. 3, 2022

(30) Foreign Application Priority Data

Aug. 31, 2020 (TW) .................. 109129717

(51) Int. Cl.
*H01L 23/48* (2006.01)
*H01L 23/00* (2006.01)

(52) U.S. Cl.
CPC .............. *H01L 24/81* (2013.01); *H01L 24/16* (2013.01); *H01L 2224/16148* (2013.01); *H01L 2224/81193* (2013.01); *H01L 2224/81895* (2013.01); *H01L 2224/81896* (2013.01)

(58) Field of Classification Search
None
See application file for complete search history.

(56) References Cited

U.S. PATENT DOCUMENTS

| 2013/0187293 A1* | 7/2013 | Sakai | H01L 24/75 |
| | | | 250/492.1 |
| 2015/0061115 A1* | 3/2015 | Chen | H01L 21/56 |
| | | | 257/737 |

FOREIGN PATENT DOCUMENTS

| TW | 201250871 | 12/2012 |
| TW | I614864 | 2/2018 |
| TW | I635782 | 9/2018 |
| TW | 202029410 | 8/2020 |

* cited by examiner

*Primary Examiner* — Hung K Vu
(74) *Attorney, Agent, or Firm* — JCIPRNET

(57) ABSTRACT

A fabrication method of an electronic device bonding structure includes the following steps. A first electronic component including a first conductive bonding portion is provided. A second electronic component including a second conductive bonding portion is provided. A first organic polymer layer is formed on the first conductive bonding portion. A second organic polymer layer is formed on the second conductive bonding portion. Bonding is performed on the first electronic component and the second electronic component through the first conductive bonding portion and the second conductive bonding portion, such that the first electronic component and the second electronic component are electrically connected. The first organic polymer layer and the second organic polymer layer diffuse into the first conductive bonding portion and the second conductive bonding portion after the bonding. An electronic device bonding structure is also provided.

8 Claims, 16 Drawing Sheets

ELECTRONIC DEVICE BONDING STRUCTURE AND FABRICATION METHOD THEREOF

CROSS-REFERENCE TO RELATED APPLICATION

This application claims the priority benefit of Taiwan application serial no. 109129717, filed on Aug. 31, 2020. The entirety of the above-mentioned patent application is hereby incorporated by reference herein and made a part of this specification.

BACKGROUND

Technical Field

The disclosure relates to a bonding structure and a fabrication method thereof, and in particular, to an electronic device bonding structure and a fabrication method thereof.

Description of Related Art

Generally, a number of factors may affect the quality of electronic products. For instance, in an electronic device bonding structure, an oxidation problem may occur most of the time on a bonding surface because of process conditions. Further, the surface planarization levels and material properties (e.g., the material composition and die microstructure of the material itself) of the devices to be bonded may affect the bonding strength as well. As such, how to design an electronic device bonding structure through which the oxidation problem which occurs on the bonding surface may be effectively improved, the bonding strength may be enhanced, and favorable product quality may be provided, is an important issue.

SUMMARY

The disclosure provides an electronic device bonding structure and a fabrication method thereof through which an oxidation problem which occurs on a bonding surface may be effectively improved, bonding strength may be enhanced, and favorable product quality may be provided.

A fabrication method of an electronic device bonding structure provided by the disclosure includes but is not limited to the following steps. A first electronic component including but is not limited to a first conductive bonding portion is provided. A second electronic component including but is not limited to a second conductive bonding portion is provided. A first organic polymer layer is formed on the first conductive bonding portion. A second organic polymer layer is formed on the second conductive bonding portion. Bonding is performed on the first electronic component and the second electronic component through the first conductive bonding portion and the second conductive bonding portion, such that the first electronic component and the second electronic component are electrically connected. The first organic polymer layer and the second organic polymer layer diffuse into the first conductive bonding portion and the second conductive bonding portion after the bonding.

In an embodiment of the disclosure, the first conductive bonding portion and the second conductive bonding portion are metal-to-metal bonding.

In an embodiment of the disclosure, a method for forming the first organic polymer layer and the second organic polymer layer is to perform a wet process on the first conductive bonding portion and the second conductive bonding portion by using an organic polymer solution.

In an embodiment of the disclosure, the wet process includes but is not limited to the following step. The first conductive bonding portion and the second conductive bonding portion are immersed into the organic polymer solution, or the organic polymer solution is sprayed on the first conductive bonding portion and the second conductive bonding portion.

In an embodiment of the disclosure, When the material of the first conductive bonding portion and the material of the second conductive bonding portion are copper, the organic polymer solution includes but is not limited to a compound having a nitrogen-containing functional group, a sulfur-containing functional group, or a combination of the foregoing.

In an embodiment of the disclosure, a thickness of each of the first organic polymer layer and the second organic polymer layer is at least less than 2 micrometers before the bonding.

In an embodiment of the disclosure, the first organic polymer layer completely covers an exposed surface of the first conductive bonding portion, and the second organic polymer layer completely covers an exposed surface of the second conductive bonding portion before the bonding.

In an embodiment of the disclosure, an amount of the first organic polymer layer and an amount of the second organic polymer layer gradually decrease when bonding is performed.

In an embodiment of the disclosure, a material of the first organic polymer layer is identical to a material of the second organic polymer layer.

In an embodiment of the disclosure, a material of the first organic polymer layer and a material of the second organic polymer layer are not conductive.

In an embodiment of the disclosure, the bonding performed on the first electronic component and the second electronic component is performed through a thermal lamination process.

In an embodiment of the disclosure, the first organic polymer layer is further formed on a surface of first electronic component opposite to the first conductive bonding portion, and the second organic polymer layer is further formed on a surface of second electronic component opposite to the second conductive bonding portion.

An electronic device bonding structure includes but is not limited to a first electronic component and a second electronic component. The first electronic component includes but is not limited to a first conductive bonding portion. The second electronic component includes but is not limited to a second conductive bonding portion. The second conductive bonding portion is bonded to the first conductive bonding portion, such that the first electronic component and the second electronic component are electrically connected. Dies in the first conductive bonding portion and dies in the second conductive bonding portion have a refinement die distribution structure.

In an embodiment of the disclosure, the refinement die distribution structure is a structure in which sizes of part of the dies in the first conductive bonding portion and the second conductive bonding portion close to a bonding junction of the first conductive bonding portion and the second conductive bonding portion are less than sizes of part of the dies away from the bonding junction of the first conductive bonding portion and the second conductive bonding portion.

In an embodiment of the disclosure, the first electronic component and the second electronic component include but is not limited to wafer-to-wafer bonding or circuit substrate-to-circuit substrate bonding.

In an embodiment of the disclosure, the first conductive bonding portion and the second conductive bonding portion respectively are a conductive bump and a conductive pad.

In an embodiment of the disclosure, a plurality of the first conductive bonding portions and a plurality of the second conductive bonding portions are provided, and a cavity is formed between adjacent first conductive bonding portions and between adjacent second conductive bonding portions.

In an embodiment of the disclosure, the cavity does not have an underfill.

In an embodiment of the disclosure, the first conductive bonding portion directly contacts the second conductive bonding portion.

In an embodiment of the disclosure, the electronic device bonding structure includes but is not limited to a first organic polymer layer and a second organic polymer layer. The first organic polymer layer is located on a surface of the first electronic component opposite to the first conductive bonding portion. The second organic polymer layer is located on a surface of the second electronic component opposite to the second conductive bonding portion.

To sum up, in the disclosure, the organic polymer layers are formed on the conductive bonding portions of the electronic components to be bonded. In this way, the organic polymer layers may protect the conductive bonding portions on the electronic components, such that the oxidation problem which occurs on the bonding surface is effectively improved. In addition, the organic polymer layers may diffuse into the conductive bonding portions as affected by the bonding, a new compound is thereby formed in the conductive bonding portions, and the die microstructure thus changes. A columnar micro structure is changed to an improved refinement die distribution structure, such that the die microstructure in the conductive bonding portions is enhanced, and the bonding strength is improved. As such, in the electronic device bonding structure and the fabrication method thereof provided by the disclosure, the oxidation problem which occurs on the bonding surface may be effectively improved, the bonding strength is also enhanced, and favorable product quality is therefore provided.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
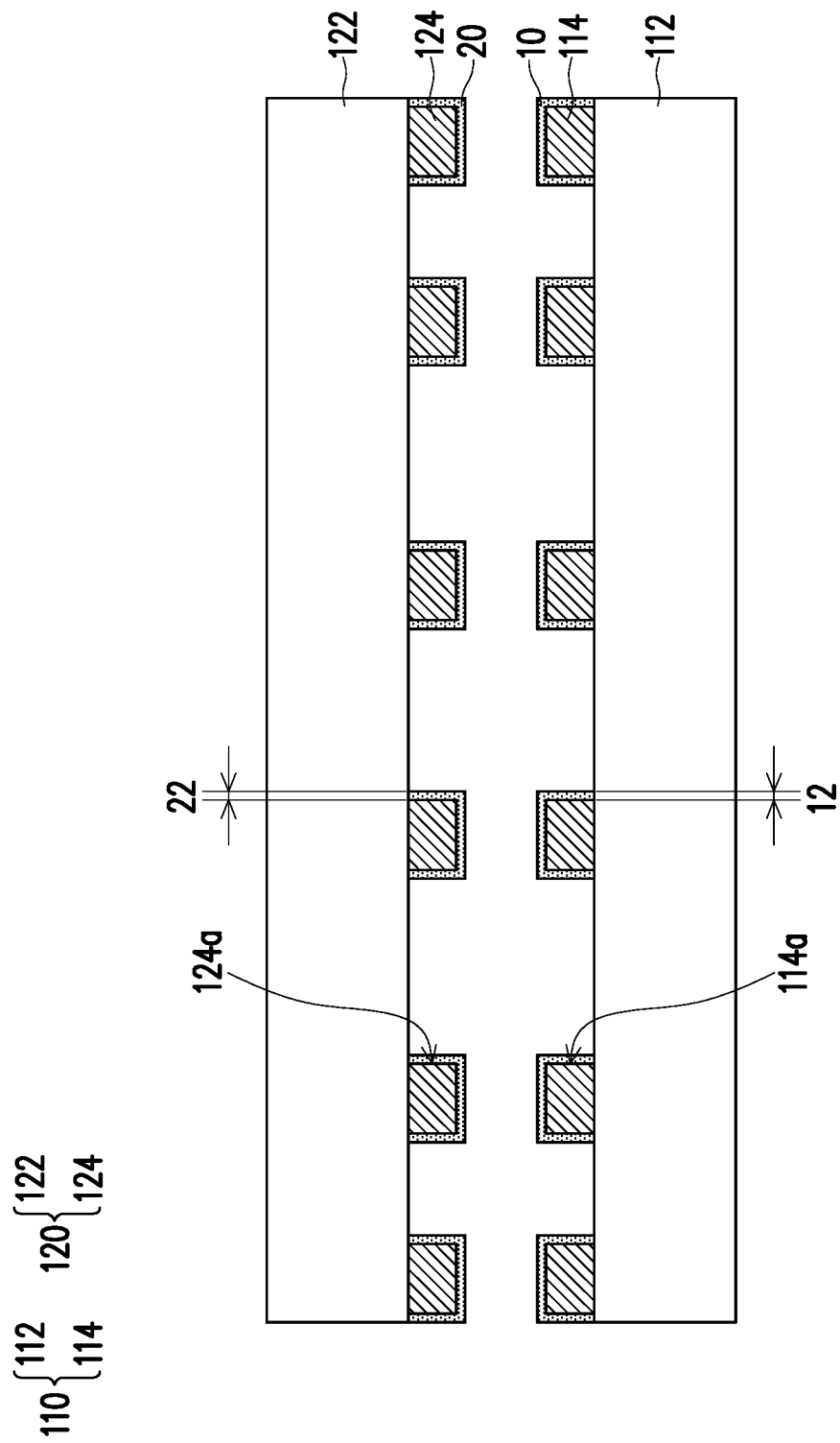
FIG. 1A to FIG. 1C are partial cross-sectional schematic views of part of a fabrication method of an electronic device bonding structure according to an embodiment of the disclosure.

It should be understood that the foregoing and other detailed descriptions, features, and effects are intended to be described more comprehensively by providing embodiments accompanied with drawings hereinafter. In the following exemplary embodiments, wordings used to indicate directions, such as "up", "down", "front", "back", "left", and "right" merely refer to directions in the accompanying drawings. Therefore, the directional wordings are used to illustrate rather than limit the disclosure.

In detailed description of each embodiment, the terms "first", "second", etc., may be used herein to describe different elements. These terms are used to distinguish the elements, but in the structure, these elements should not be limited by these terms. For instance, the first element may be called as the second element, and similarly, the second element may be called as the first element without departing from the protection scope of the concept of the disclosure. Besides, in the fabrication method, except certain fabrication flows, the order of forming these devices or members should not be limited by these terms. For instance, the first element may be formed before the second element. Alternatively, the first element may be formed after the second element, or the first element and the second element may be formed in the same process or step.

Further, thicknesses of layers and regions in the drawings are enlarged for clarity. The same reference numbers are used in the drawings and the description to indicate the same or like parts, which are not repeated in the following embodiments.

Figure 1B:
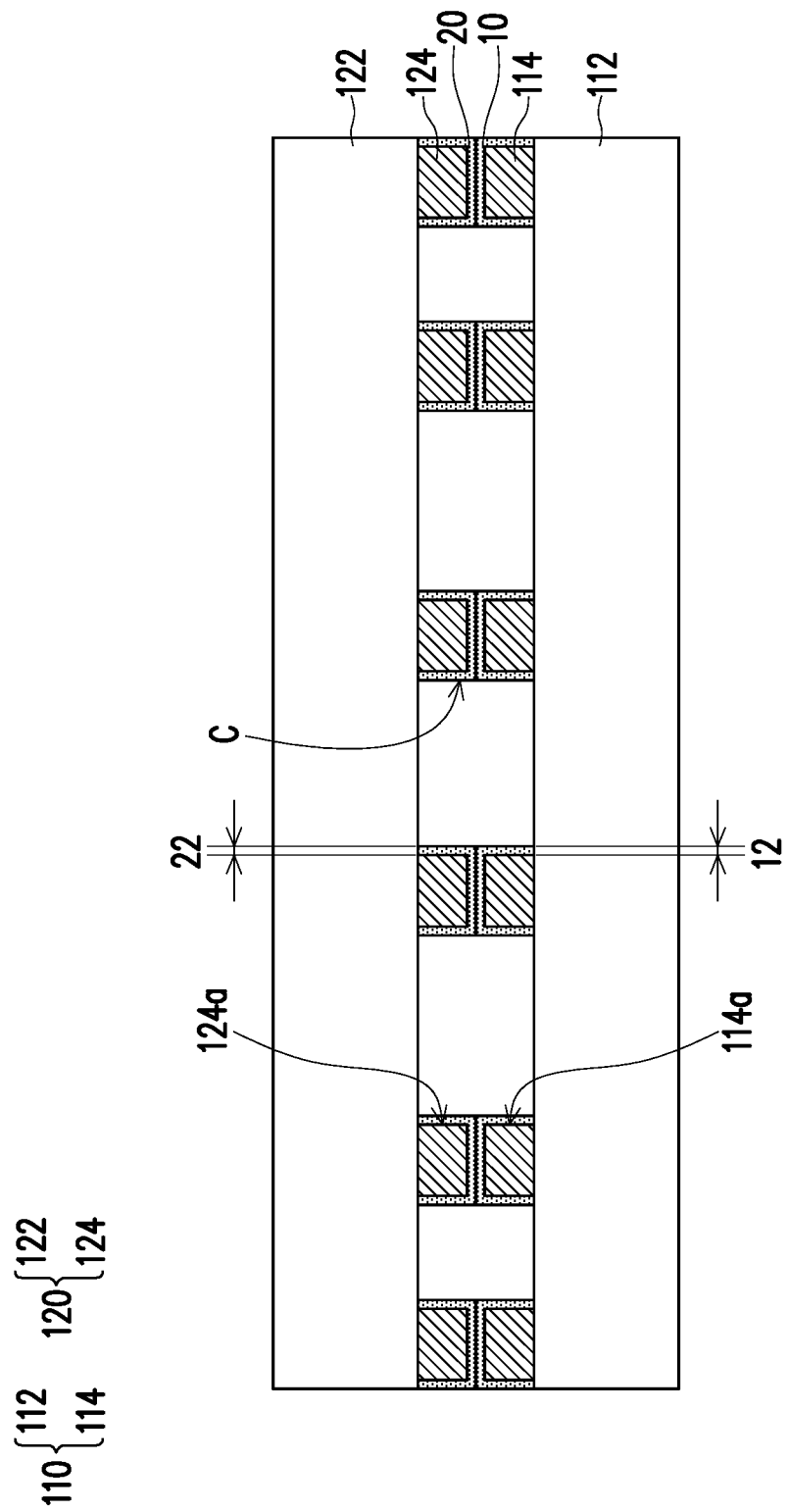
Figure 1C:
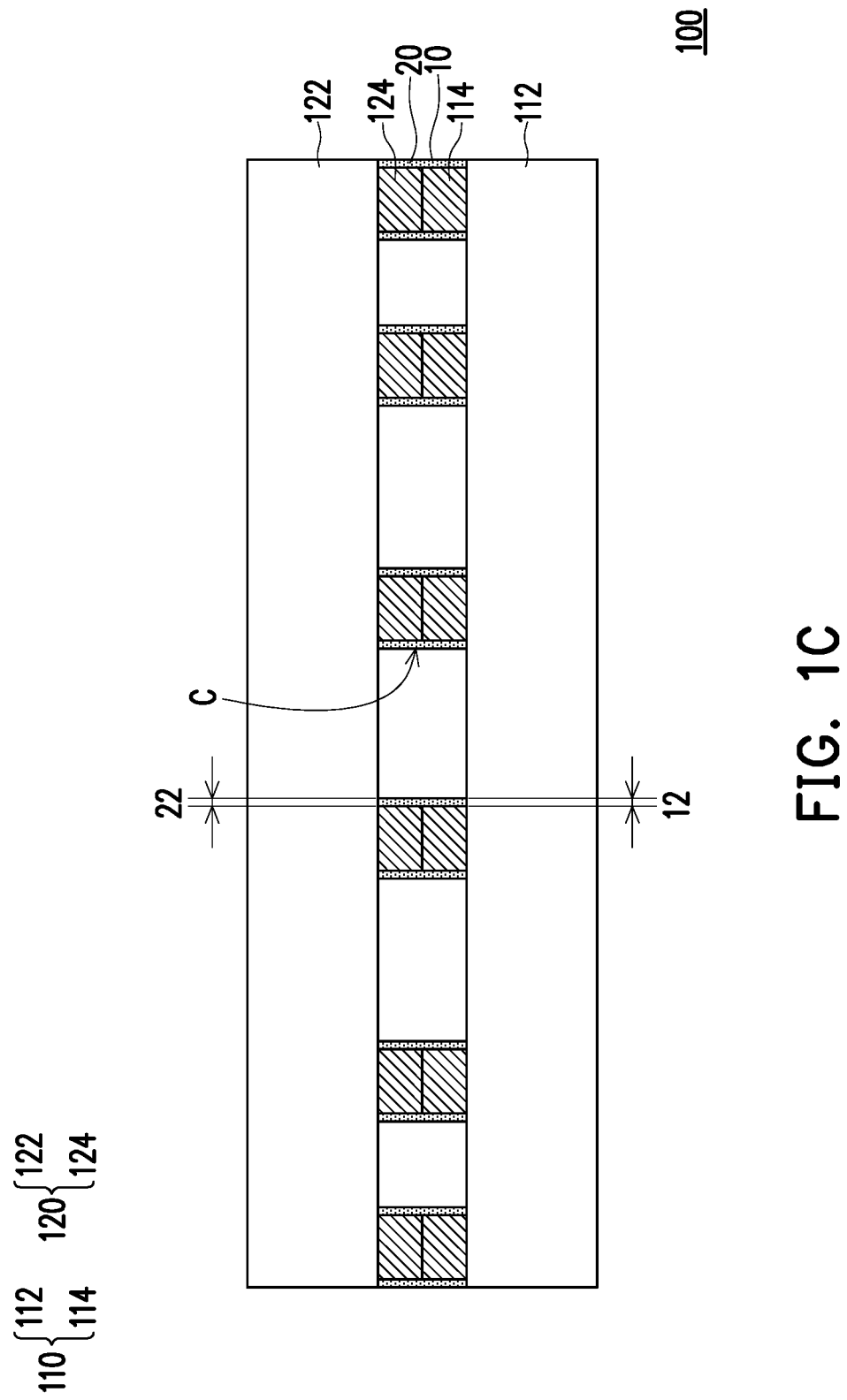
Figure 1E:
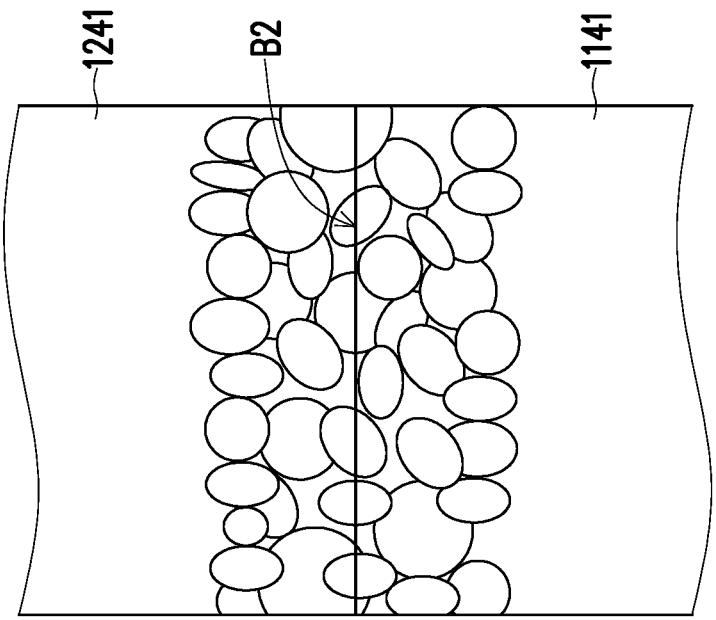
FIG. 1E is a schematic diagram of part of die structures of a first conductive bonding portion and a second conductive bonding portion in an electronic device bonding structure of related art.
Figure 1D:
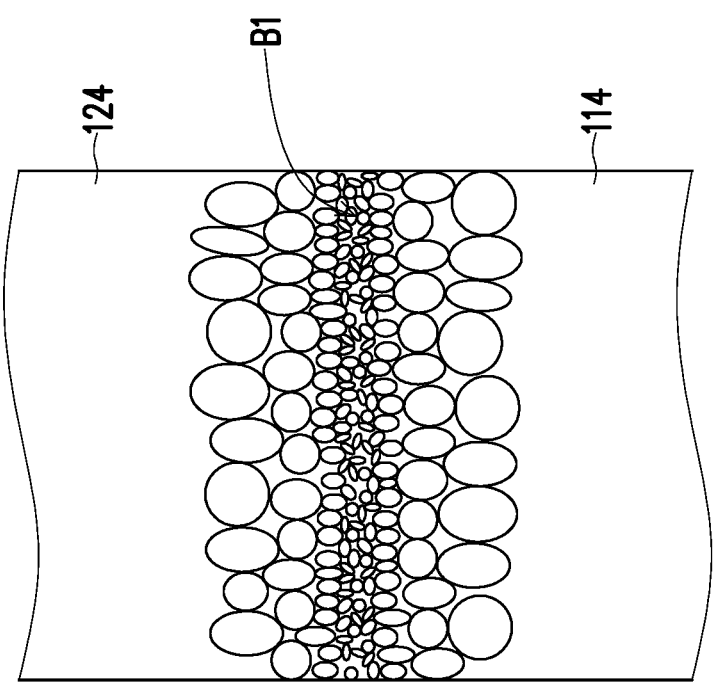
FIG. 1D is a schematic diagram of part of die structures of a first conductive bonding portion and a second conductive bonding portion in the electronic device bonding structure according to an embodiment of the disclosure.

FIG. 1A to FIG. 1C are partial cross-sectional schematic views of part of a fabrication method of an electronic device bonding structure according to an embodiment of the disclosure. In this embodiment, a fabrication process of an electronic device bonding structure 100 may include but is not limited to the following steps. FIG. 1D is a schematic diagram of part of die structures of a first conductive bonding portion and a second conductive bonding portion in the electronic device bonding structure according to an embodiment of the disclosure. FIG. 1E is a schematic diagram of part of die structures of a first conductive bonding portion and a second conductive bonding portion in an electronic device bonding structure of related art.

With reference to FIG. 1A, a first electronic component 110 and a second electronic component 120 are provided.

Herein, the first electronic component 110 may include but is not limited to a first substrate 112 and a first conductive bonding portion 114, and the second electronic component 120 may include but is not limited to a second substrate 122 and a second conductive bonding portion 124.

In some embodiments, the first substrate 112 is, for example, a semiconductor wafer or a circuit substrate, and the second substrate 122 is, for example, a semiconductor wafer or a circuit substrate. For instance, the first substrate 112 and the second substrate 122 are both semiconductor wafers, for example, such that bonding of the first electronic component 110 and the second electronic component 120 performed subsequently may be wafer-to-wafer bonding. Alternatively, the first substrate 112 and the second substrate 122 are both circuit substrates, for example, such that bonding of the first electronic component 110 and the second electronic component 120 performed subsequently may be circuit substrate-to-circuit substrate bonding.

In some embodiments, the first conductive bonding portion 114 and the second conductive bonding portion 124 respectively are a conductive bump and a conductive pad. For instance, as shown in FIG. 1A, the first conductive bonding portion 114 and the second conductive bonding portion 124 may both be conductive bumps, but the disclosure should not be construed as limited thereto. Note that types of the first substrate 112, the second substrate 122, the first conductive bonding portion 114, and the second conductive bonding portion 124 are not limited in the disclosure and may be determined according to actual design needs.

With reference to FIG. 1A, organic polymer layers may be formed on a portion where the first electronic component 110 and the second electronic component 120 are bonded, such that the first electronic component 110 and the second electronic component 120 are protected in the following bonding process, and that an oxidation problem which occurs on a bonding surface may be effectively improved. For instance, a first organic polymer layer 10 is formed on the first conductive bonding portion 114 of the first electronic component 110, for example, and a second organic polymer layer 20 is formed on the second conductive bonding portion 124 of the second electronic component 120.

In this embodiment, the first organic polymer layer 10 may completely cover an exposed surface 114a of the first conductive bonding portion 114, and the second organic polymer layer 20 may completely cover an exposed surface 124a of the second conductive bonding portion 124. In other words, the first organic polymer layer 10 may complete cover a top surface and a side wall of the first conductive bonding portion 114, and the second organic polymer layer 20 may completely cover a top surface and a side wall of the second conductive bonding portion 124, but the disclosure should not be construed as limited thereto.

In an embodiment, the organic polymer layers may have less thicknesses before bonding is performed. For instance, each of a thickness 12 of the first organic polymer layer 10 and a thickness 22 of the second organic polymer layer 20 may at least be less than 2 micrometers ($\mu$m), but the disclosure should not be construed as limited thereto. Thicknesses of the organic polymer layers may be adjusted according to actual conditions.

In an embodiment, a material of the first organic polymer layer 10 and a material of the second organic polymer layer 20 may not be conductive. To be specific, since the organic polymer layers are thin molecular layers, even though the material of the first organic polymer layer 10 and the material of the second organic polymer layer 20 are not conductive, electrical performance of the first electronic component 110 and the second electronic component 120 after being bonded is not affected, but the disclosure should not be construed as limited thereto.

In some embodiments, a method for forming the first organic polymer layer 10 and the second organic polymer layer 20 may be to perform a wet process on the first conductive bonding portion 114 of the first electronic component 110 and the second conductive bonding portion 124 of the second electronic component 120 by using an organic polymer solution.

For instance, in an embodiment, the first conductive bonding portion 114 of the first electronic component 110 and the second conductive bonding portion 124 of the second electronic component 120 may be immersed into the organic polymer solution for the wet process, for example. Nevertheless, the disclosure should not be construed as limited thereto. In another embodiment, the first conductive bonding portion 114 of the first electronic component 110 and the second conductive bonding portion 124 of the second electronic component 120 may be sprayed with the organic polymer solution for the wet process, for example.

To be specific, since a functional group of the organic polymer solution may be selective to metal, when the wet process is performed by using the organic polymer solution, the organic polymer layers are formed only on metal material surfaces of the first electronic component 110 and the second electronic component 120, and the organic polymer layers are not formed on dielectric material surfaces of the first electronic component 110 and the second electronic component 120. In other words, an organic polymer solution with a corresponding functional group may be selected in the wet process according to metal materials in the first electronic component 110 and the second electronic component 120, such that required organic polymer layers may be formed on the metal material surfaces thereof.

Therefore, in some embodiments, when a material of the first conductive bonding portion 114 of the first electronic component 110 and a material of the second conductive bonding portion 124 of the second electronic component 120 are metal, the first organic polymer layer 10 and the second organic polymer layer 20 may be respectively formed on the first conductive bonding portion 114 and the second conductive bonding portion 124 by the organic polymer solution. For instance, the material of the first conductive bonding portion 114 and the material of the second conductive bonding portion 124 are, for example, copper, nickel, or gold. Herein, when the material of the first conductive bonding portion 114 and the material of the second conductive bonding portion 124 are copper, the organic polymer solution may include but is not limited to a compound having a nitrogen-containing functional group, a sulfur-containing functional group, or a combination of the foregoing.

For instance, the compound having a nitrogen-containing functional group is, for example, a compound having benzotriazole or amine. Herein, the structural formula of the compound with benzotriazole may be represented by the following formula (1), formula (2), formula (3), and formula (4), and the structural formula of the compound with amine may be represented by the following formula (5) and formula (6). The compound having a sulfur-containing functional group is, for example, a compound with silane, and the structural formula of the compound with silane may be represented by the following formula (7). Nevertheless, the disclosure should not be construed as limited thereto. The compound having a nitrogen-containing functional group or a sulfur-containing functional group may be any other suitable compounds.

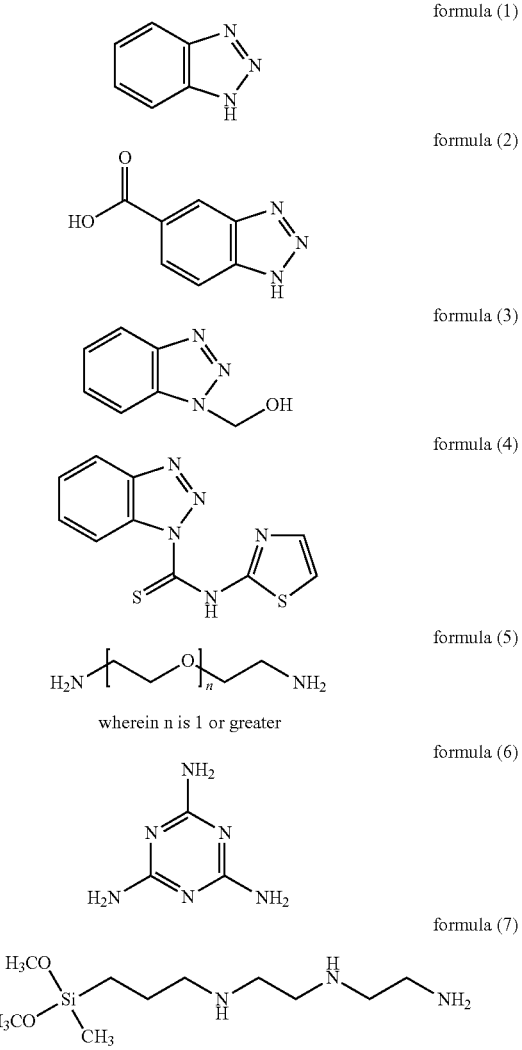

wherein n is 1 or greater

In an embodiment, the same organic polymer solution may be used for the first electronic component 110 and the second electronic component 120 in the wet process. Therefore, the material of the first organic polymer layer 10 and the material of the second organic polymer layer 20 may be the same, such that the first organic polymer layer 10 and the second organic polymer layer 20 may diffuse uniformly in the following process when diffusing, and favorable product quality is thereby achieved.

Note that the concentration of the organic polymer solution is not limited in the disclosure, and the concentration of the organic polymer solution may be adjusted according to actual design needs.

With reference to FIG. 1B and FIG. 1C together, in this embodiment, bonding is performed on the first electronic component 110 and the second electronic component 120 through the first conductive bonding portion 114 and the second conductive bonding portion 124, such that the first electronic component 110 and the second electronic component 120 are electrically connected. Herein, the first organic polymer layer 10 and the second organic polymer layer 20 diffuse into the first conductive bonding portion 114 and the second conductive bonding portion 124 after the bonding, such that dies in the first conductive bonding portion 114 and dies in the second conductive bonding portion 124 have a refinement die distribution structure. For instance, as shown in FIG. 1D, the refinement die distribution structure may be a structure in which sizes of part of the dies in the first conductive bonding portion 114 and the second conductive bonding portion 124 close to a bonding junction B1 of the first conductive bonding portion 114 and the second conductive bonding portion 124 are less than sizes of part of the dies away from the bonding junction B1 of the first conductive bonding portion 114 and the second conductive bonding portion 124. Therefore, compared to the related art (as shown in FIG. 1E) in which sizes of part of dies in a first conductive bonding portion 1141 and a second conductive bonding portion 1241 close to a bonding junction B2 of the first conductive bonding portion 1141 and the second conductive bonding portion 1241 are similar to sizes of part of the dies away from the bonding junction B2 of the first conductive bonding portion 1141 and the second conductive bonding portion 1241, in the electronic device bonding structure 100 provided by this embodiment, the oxidation problem which occurs on the bonding surface may be effectively improved, bonding strength is also enhanced, and favorable product quality may thereby be provided.

In some embodiments, when the materials of the first conductive bonding portion 114 and the second conductive bonding portion 124 are copper, the sizes of part of the dies in the first conductive bonding portion 114 and the second conductive bonding portion 124 close to the bonding junction B1 of the first conductive bonding portion 114 and the second conductive bonding portion 124 may be 0.1 µm to 0.4 µm, and the sizes of part of the dies in the first conductive bonding portion 114 and the second conductive bonding portion 124 away from the bonding junction B1 of the first conductive bonding portion 114 and the second conductive bonding portion 124 may be greater than 1 µm. In comparison, in the related art, the sizes of part of the dies in the first conductive bonding portion 1141 and the second conductive bonding portion 1241 close to the bonding junction B2 of the first conductive bonding portion 1141 and the second conductive bonding portion 1241 may be greater than 0.5 µm to 1 µm, and the sizes of part of the dies in the first conductive bonding portion 1141 and the second conductive bonding portion 1241 away from the bonding junction B2 of the first conductive bonding portion 1141 and the second conductive bonding portion 1241 may be greater than 1 µm. As such, in the electronic device bonding structure 100 provided by this embodiment, the oxidation problem which occurs on the bonding surface may be effectively improved, the bonding strength is also enhanced, and favorable product quality is therefore provided.

In some embodiments, the first conductive bonding portion 114 and the second conductive bonding portion 124 may be bonded in a low-temperature process. The temperature of the low-temperature process is between 200° C. and 250° C., for example. Generally, as affected by the working temperature and voltage, it is difficult for copper dies of a bonding interface to reach recrystallization when bonding is performed in a low-temperature process, as such, dies of the interface are large, and sizes of the dies are not uniform. Nevertheless, in a fabrication method of the electronic device bonding structure 100 provided by this embodiment, since the dies in the first conductive bonding portion 114 and the dies in the second conductive bonding portion 124 have a refinement die distribution structure, the die sizes at the bonding interface B1 exhibit favorable uniformity even in a low-temperature process, but the disclosure should not be construed as limited thereto.

To be specific, organic polymer layers (e.g., the first organic polymer layer 10 and the second organic polymer layer 20) are formed on conductive bonding portions (e.g., the first conductive bonding portion 114 and the second conductive bonding portion 124) of electronic components (e.g., the first electronic component 110 and the second electronic component 120) to be bonded. In this way, in the bonding process, the organic polymer layers (e.g., the first organic polymer layer 10 and the second organic polymer layer 20) may protect the conductive bonding portions (e.g., the first conductive bonding portion 114 and the second conductive bonding portion 124) on the electronic components (e.g., the first electronic component 110 and the second electronic component 120), and that the oxidation problem which occurs on the bonding surface may be effectively improved. In addition, the organic polymer layers (e.g., the first organic polymer layer 10 and the second organic polymer layer 20) may diffuse into the conductive bonding portions (e.g., the first conductive bonding portion 114 and the second conductive bonding portion 124) as affected by the bonding, and a new compound is thereby formed in the conductive bonding portions (e.g., the first conductive bonding portion 114 and the second conductive bonding portion 124), and a die microstructure thus changes. A columnar micro structure is changed to an improved refinement die distribution structure, such that the die microstructure in the conductive bonding portions (e.g., the first conductive bonding portion 114 and the second conductive bonding portion 124) is enhanced, and the bonding strength is improved. As such, in the electronic device bonding structure and the fabrication method thereof provided by this embodiment, the oxidation problem which occurs on the bonding surface may be effectively improved, the bonding strength is also enhanced, and favorable product quality is therefore provided.

In an embodiment, since the first organic polymer layer 10 and the second organic polymer layer 20 diffuse into the first conductive bonding portion 114 and the second conductive bonding portion 124, an amount of the first organic polymer layer 10 and an amount of the second organic polymer layer 20 gradually decrease when bonding is performed. In other words, the thickness 12 of the first organic polymer layer 10 and the thickness 22 of the second organic polymer layer 20 may gradually reduce.

In this embodiment, as shown in FIG. 1C, the first organic polymer layer 10 and the second organic polymer layer 20 located on the bonding surface of the first electronic component 110 and the second electronic component 120 may completely diffuse into the first conductive bonding portion 114 and the second conductive bonding portion 124. The first conductive bonding portion 114 may thereby directly contact the second conductive bonding portion 124.

Further, the first organic polymer layer 10 and the second organic polymer layer 20 located on side walls of the first electronic component 110 and the second electronic component 120 may partially diffuse into the first conductive bonding portion 114 and the second conductive bonding portion 124. The first organic polymer layer 10 and the second organic polymer layer 20 may form a continuous side wall. In other words, an interface is not provided between the first organic polymer layer 10 and the second organic polymer layer 20. Nevertheless, the disclosure should not be construed as limited thereto. In other embodiments that are not shown, the first organic polymer layer 10 and the second organic polymer layer 20 located on the side walls of the first electronic component 110 and the second electronic component 120 may completely diffuse into the first conductive bonding portion 114 and the second conductive bonding portion 124. Therefore, no organic polymer layer remains on the electronic device bonding structure 100. Note that for clarity, thickness changes of the side walls of the first organic polymer layer 10 and the second organic polymer layer 20 are not shown in FIG. 1B to FIG. 1C.

In an embodiment, the first electronic component 110 and the second electronic component 120 may be bonded through a thermal lamination process. Therefore, the temperature and voltage provided in the process may further facilitate diffusion of the first organic polymer layer 10 and the second organic polymer layer 20 into the first conductive bonding portion 114 and the second conductive bonding portion 124, such that a new compound is formed in the conductive bonding portions, and the die microstructure thereby changes. Therefore, the bonding strength is ensured to be effectively improved. Nevertheless, the disclosure should not be construed as limited thereto. In other embodiments, the first electronic component 110 and the second electronic component 120 may also be bonded through other suitable processes.

In an embodiment, when the materials of the first conductive bonding portion 114 and the second conductive bonding portion 124 are metal, the first conductive bonding portion 114 and the second conductive bonding portion 124 may be metal-to-metal bonding. Nevertheless, the disclosure should not be construed as limited thereto.

In this embodiment, a plurality of the first conductive bonding portions 114 and a plurality of the second conductive bonding portions 124 may be provided. A cavity C may be formed between adjacent first conductive bonding portions 114 and between adjacent second conductive bonding portions 124, as shown in FIG. 1C. Further, since the first conductive bonding portions 114 and the second conductive bonding portions 124 are effectively protected through the foregoing fabrication method, such cavity C may not have an underfill, and costs are therefore saved. Nevertheless, the disclosure should not be construed as limited thereto.

Figure 2A:
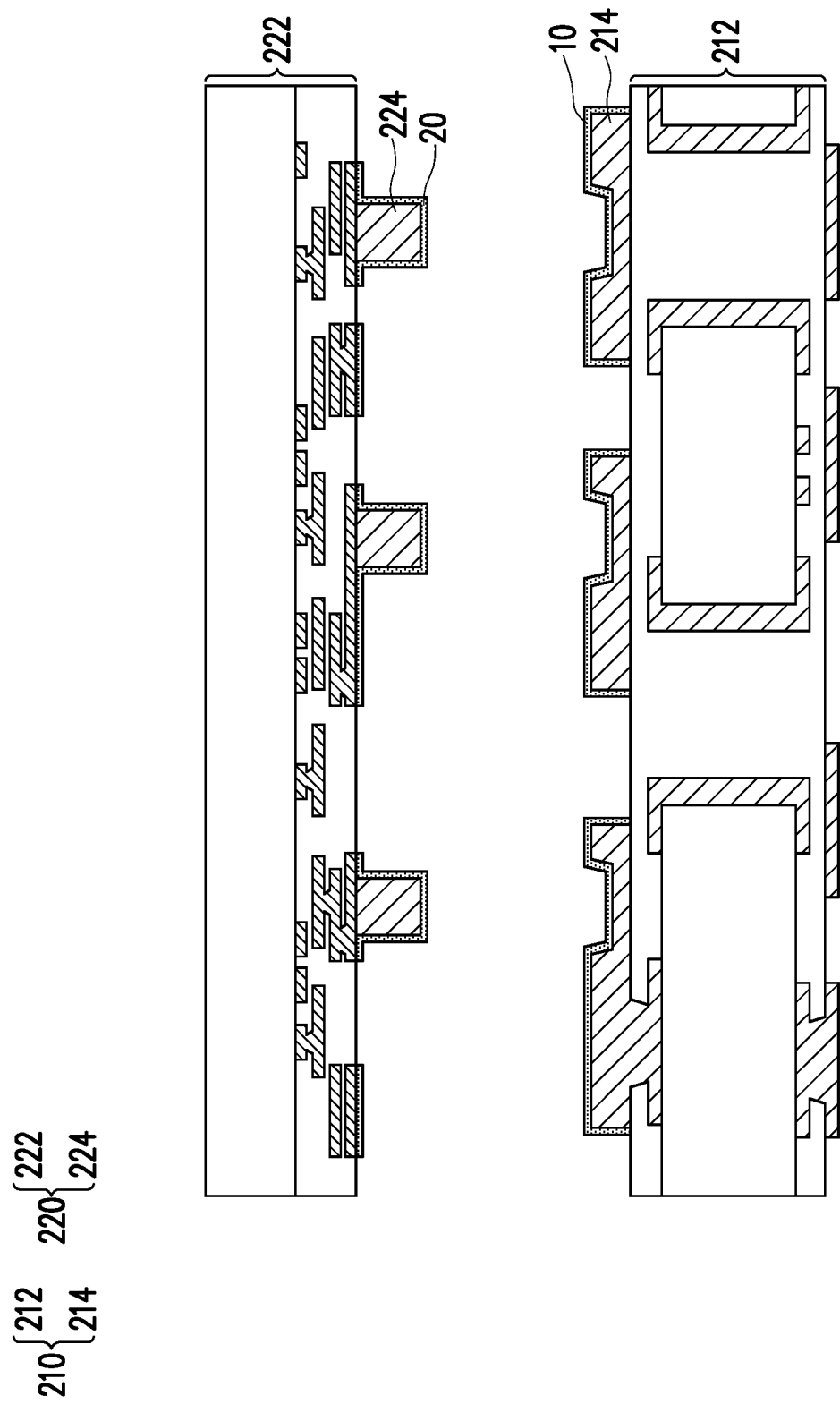
FIG. 2A to FIG. 2C are partial cross-sectional schematic views of part of a fabrication method of an electronic device bonding structure according to another embodiment of the disclosure.
Figure 2B:
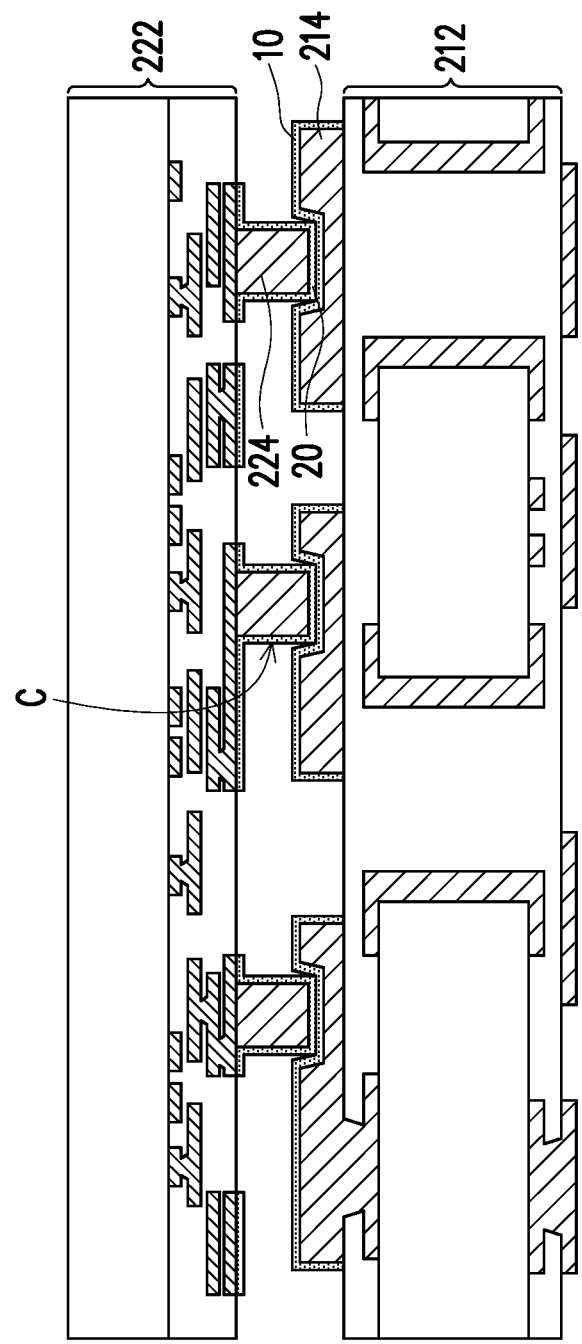
Figure 2C:
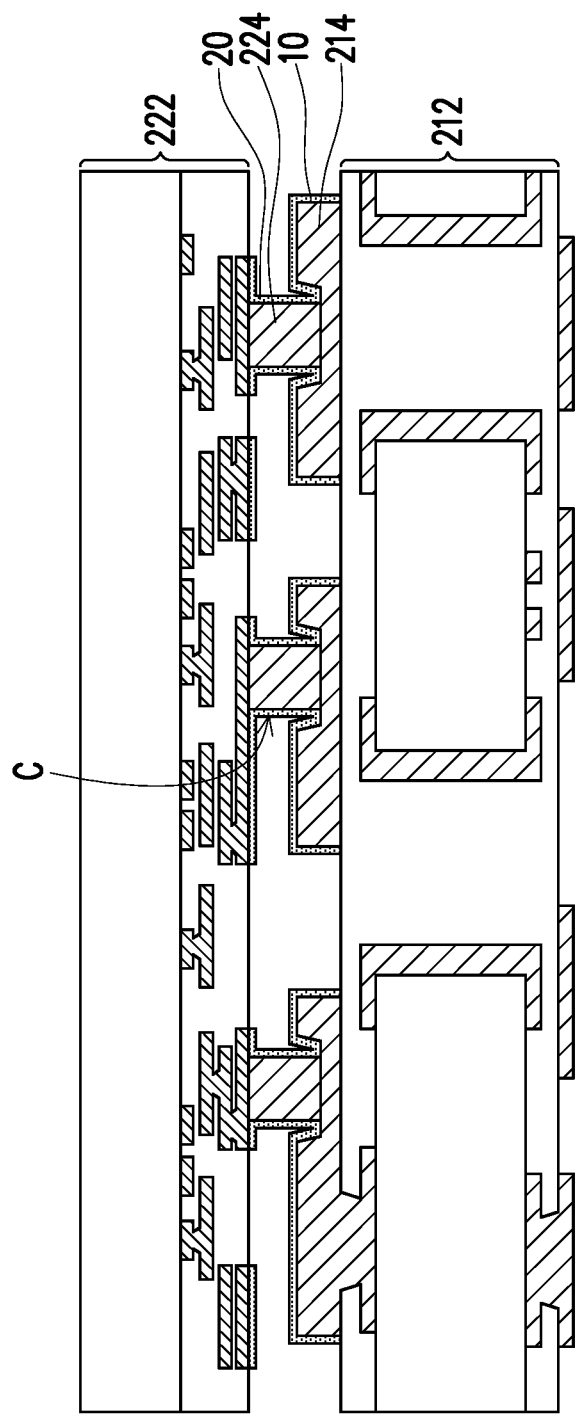
Figure 3A:
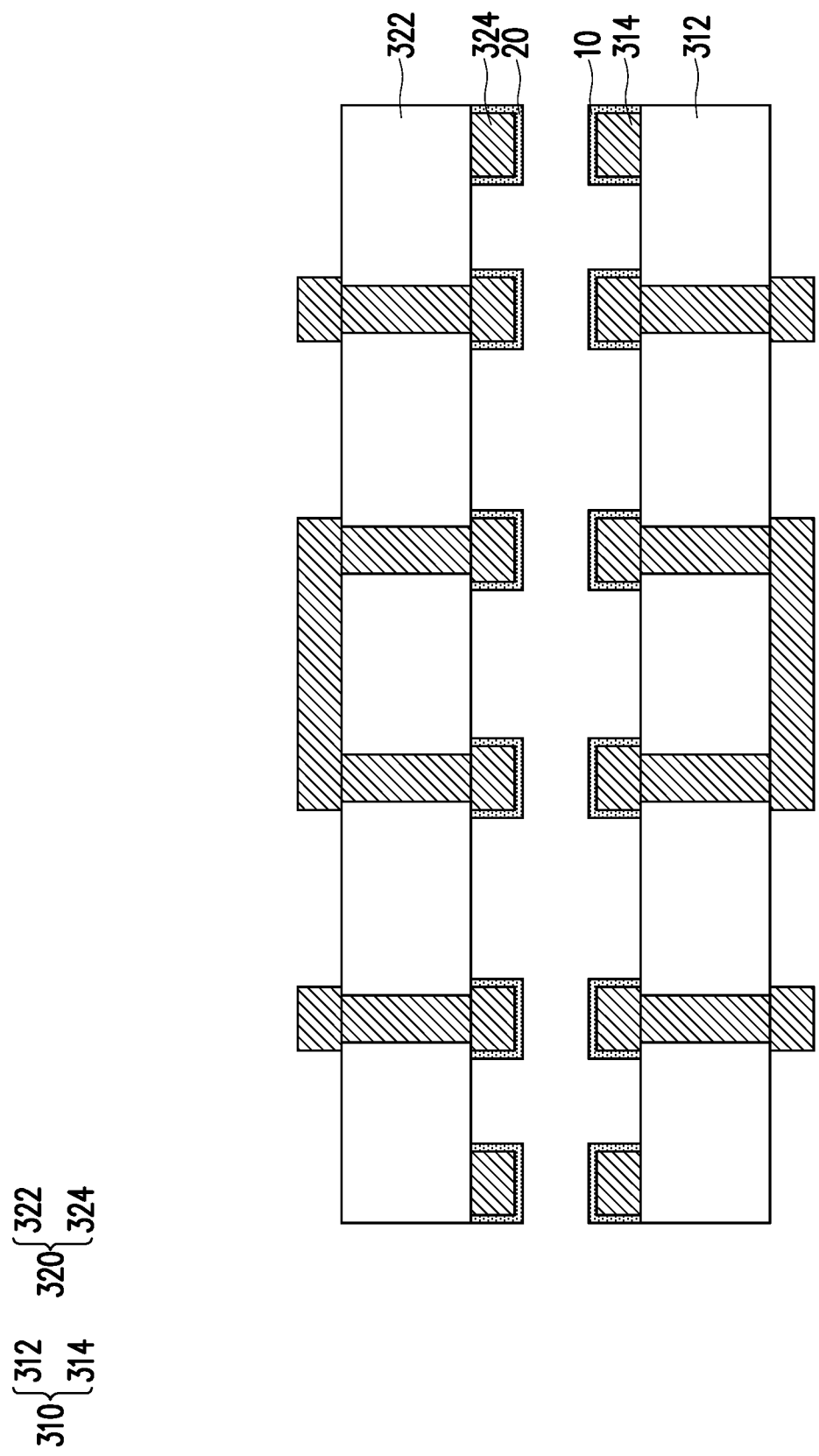
FIG. 3A to FIG. 3C are partial cross-sectional schematic views of part of a fabrication method of an electronic device bonding structure according to still another embodiment of the disclosure.
Figure 3B:
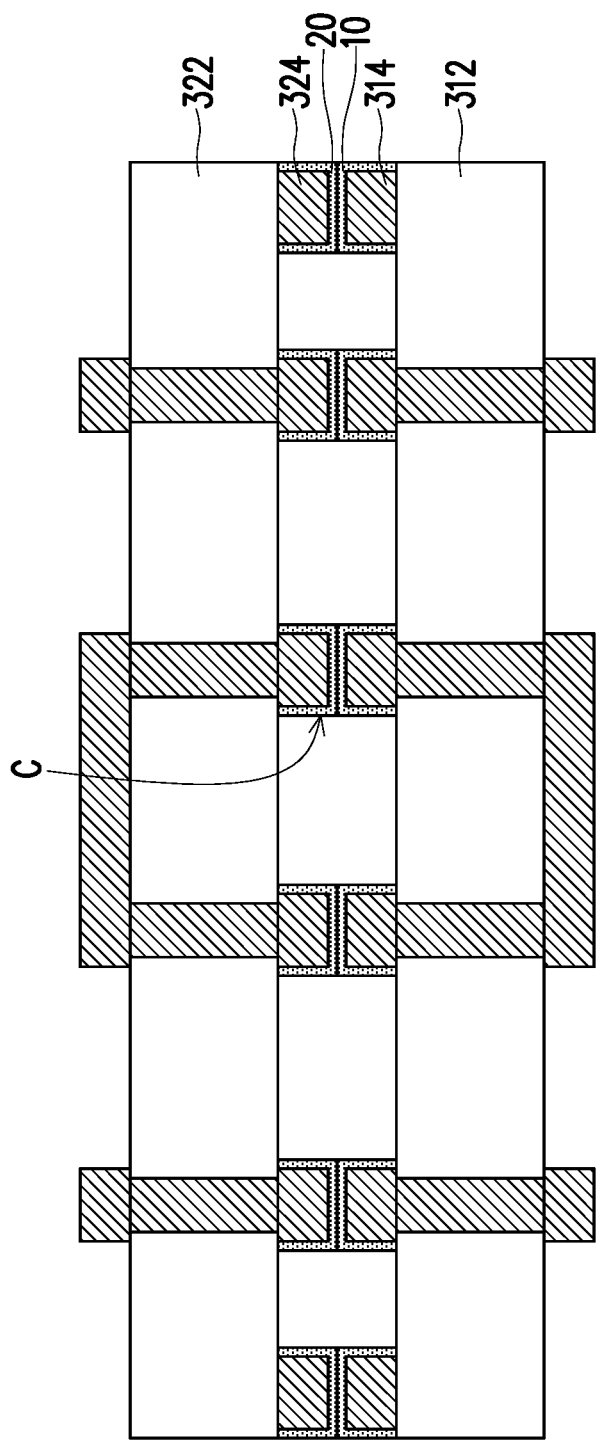
Figure 3C:
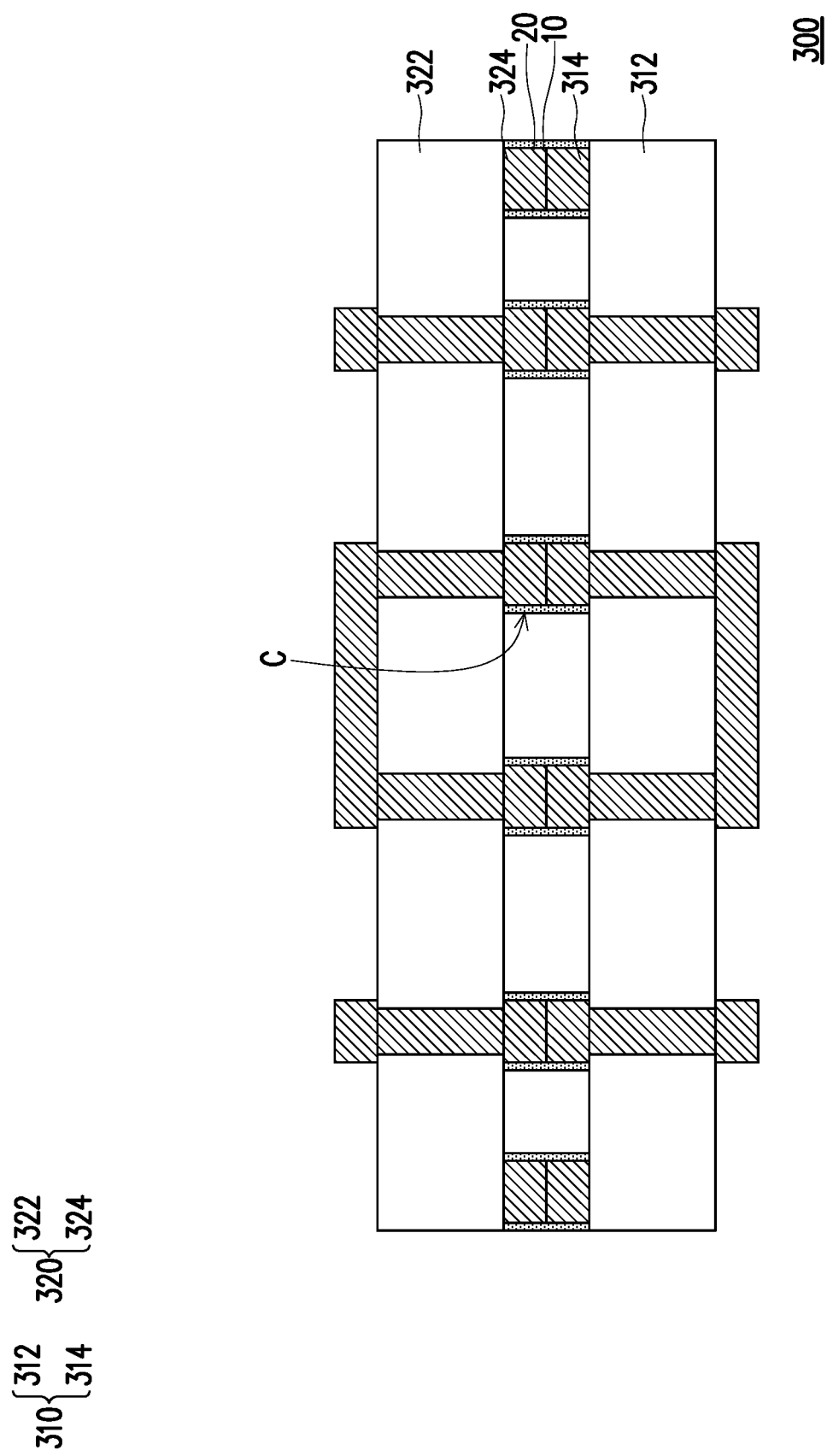

FIG. 2A to FIG. 2C are partial cross-sectional schematic views of part of a fabrication method of an electronic device bonding structure according to another embodiment of the disclosure. FIG. 3A to FIG. 3C are partial cross-sectional schematic views of part of a fabrication method of an electronic device bonding structure according to still another embodiment of the disclosure.

With reference to FIG. 2A to FIG. 2C and FIG. 3A to FIG. 3C together, similar to FIG. 1A to FIG. 1C, an electronic device bonding structure 200 in FIG. 2A to FIG. 2C and an electronic device bonding structure 300 in FIG. 3A to FIG. 3C are examples of circuit substrate-to-circuit substrate bonding.

To be specific, in the embodiments provided by FIG. 2A to FIG. 2C, a first substrate 212 of a first electronic component 210 may be an integrated circuit (IC) carrier, and a second substrate 222 of a second electronic component 220 may be a fine line substrate. Herein, the fine line substrate is defined as, for example, a chip scale package (CSP), ball grid array (BGA), or square glass carrier or a wafer substrate including a circuit design of 15 um and lower; nevertheless, the disclosure should not be construed as limited thereto. Besides, in the embodiments provided by FIG. 2A to FIG. 2C, a first conductive bonding portion 214 of the first electronic component 210 is a conductive pad, and a second conductive bonding portion 224 of the second electronic component 220 is a conductive bump.

On the other hand, in the embodiments provided by FIG. 3A to FIG. 3C, a first substrate 312 of a first electronic component 310 and a second substrate 322 of a second electronic component 320 may be double-sided circuit substrates. Besides, in the embodiments provided by FIG. 3A to FIG. 3C, a first conductive bonding portion 314 of the first electronic component 310 is a conductive bump, and a second conductive bonding portion 324 of the second electronic component 320 is a conductive bump.

Figure 4A:
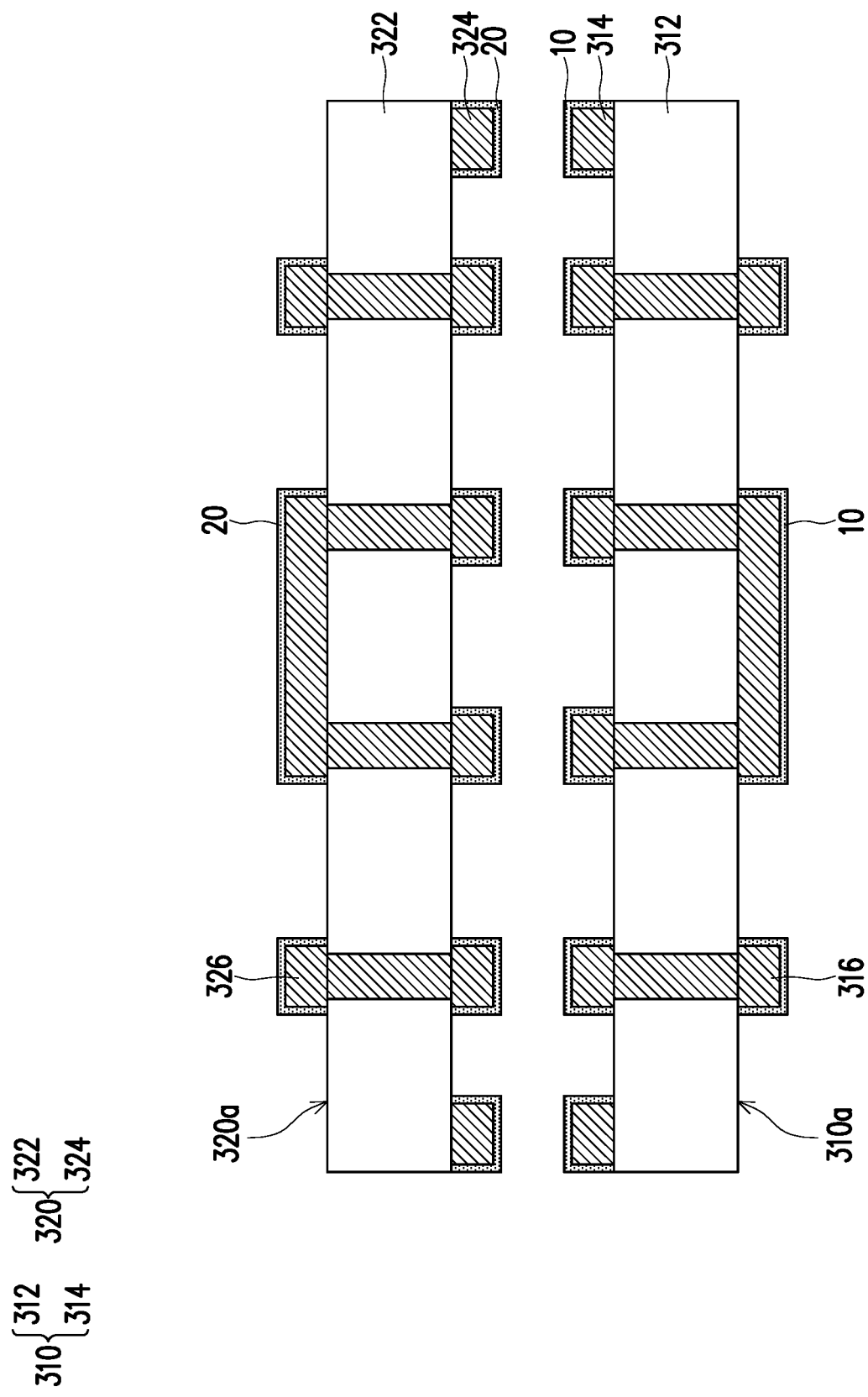
FIG. 4A to FIG. 4C are partial cross-sectional schematic views of part of a fabrication method of an electronic device bonding structure according to yet another embodiment of the disclosure.
Figure 4B:
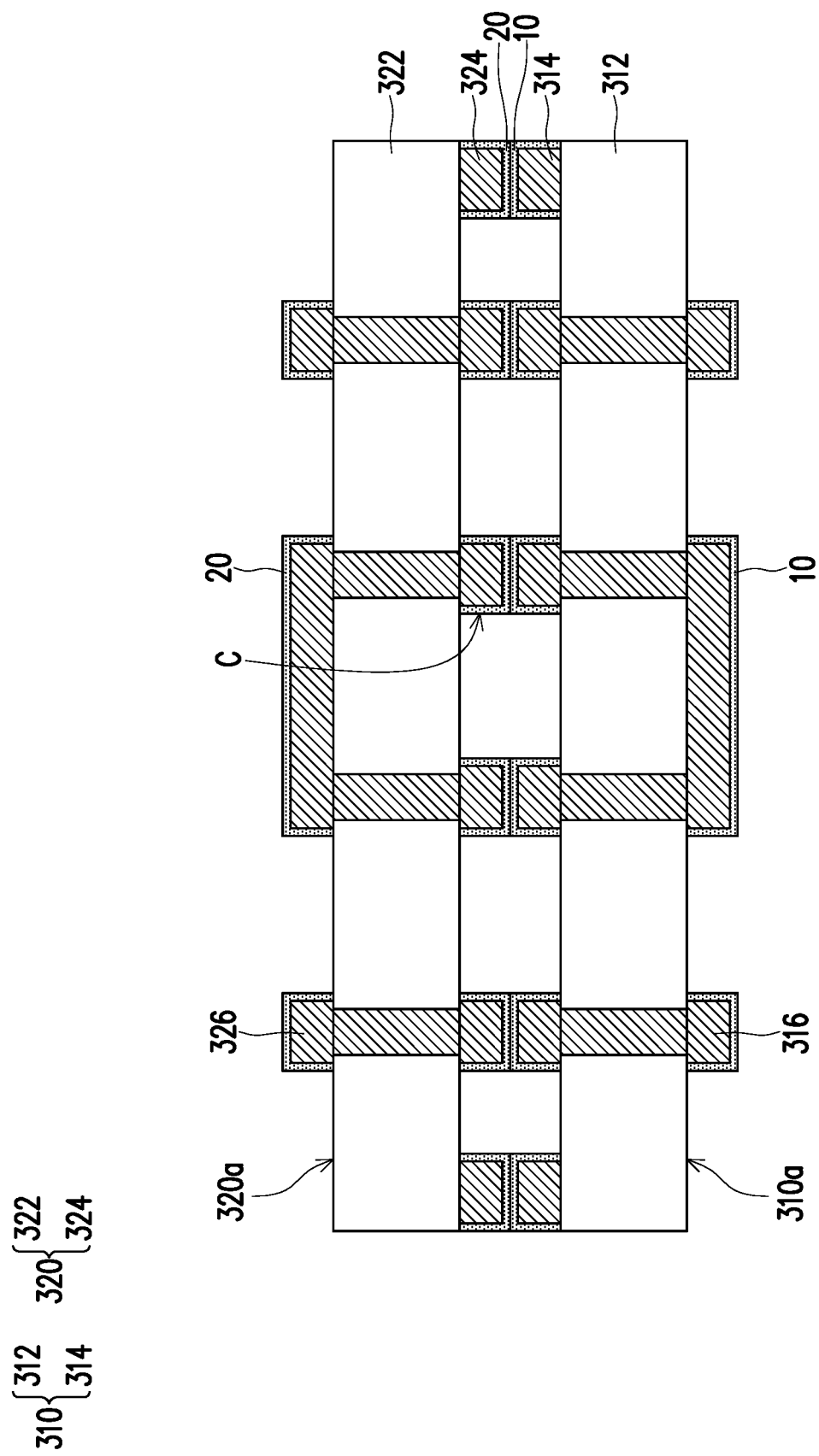
Figure 4C:
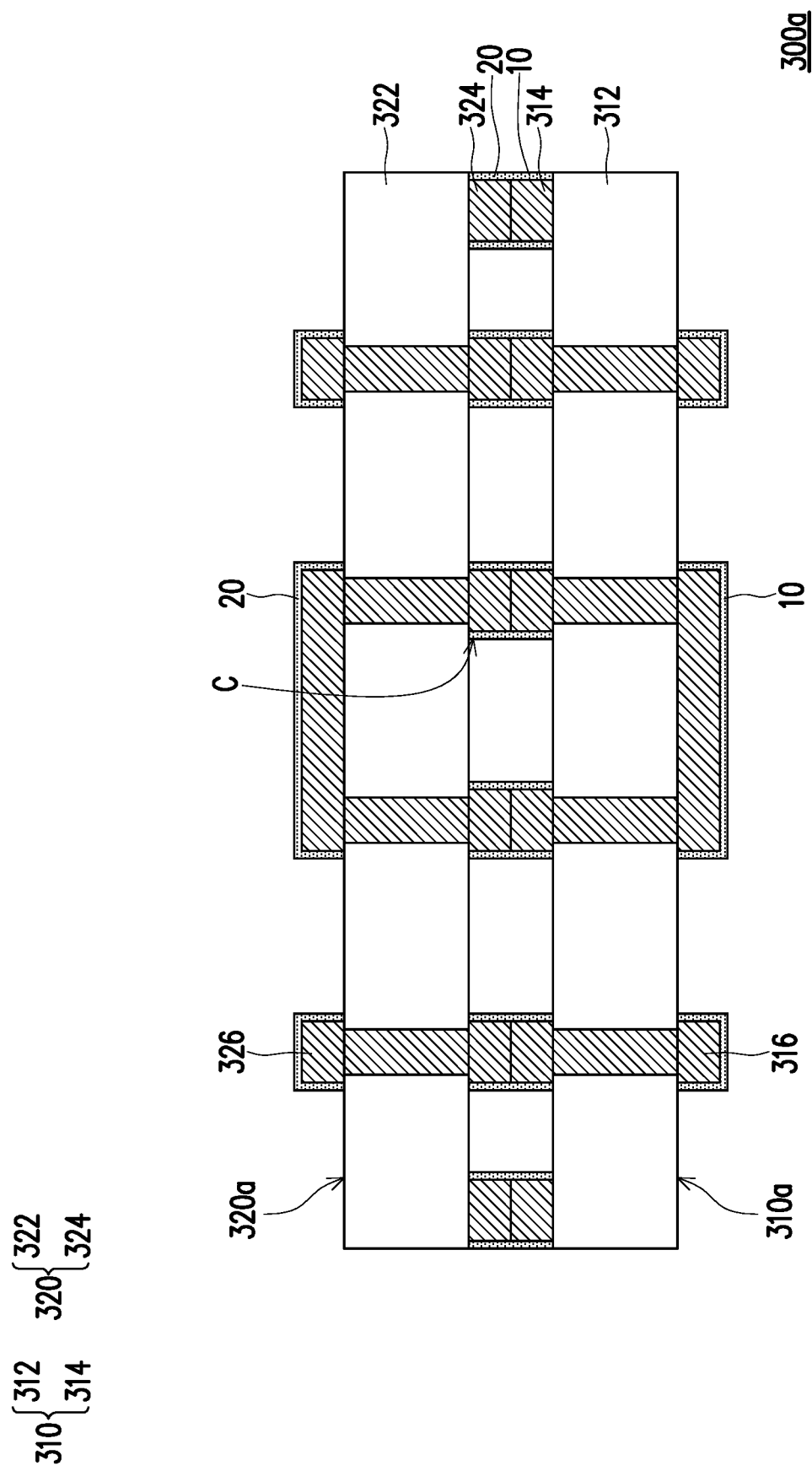

FIG. 4A to FIG. 4C are partial cross-sectional schematic views of part of a fabrication method of an electronic device bonding structure according to yet another embodiment of the disclosure. An electronic device bonding structure 300a provided in FIG. 4A to FIG. 4C is similar to that provided in FIG. 3A to FIG. 3C, but a difference therebetween lies in that the first organic polymer layer 10 may further be formed on a surface 310a of the first electronic component 310 opposite to the first conductive bonding portion 314, and the second organic polymer layer 20 may further be formed on a surface 320a of second electronic component 320 opposite to the second conductive bonding portion 324. As such, the first organic polymer layer 10 and the second organic polymer layer 20 may respectively protect a conductive member on the surface 310a of the first electronic component 310 opposite to the first conductive bonding portion 314 and a conductive member on the surface 320a of the second electronic component 320 opposite to the second conductive bonding portion 324, such that oxidation may not occur on the conductive members. In the present embodiment, the first organic polymer layer 10 may be formed only on a first conductive connecting member 316 on the surface 310a of the first conductive bonding portion 314, and the second organic polymer layer 20 may be formed only on a second conductive connecting member 326 on the surface 320a of the second conductive bonding portion 324. Nevertheless, the disclosure should not be construed as limited thereto. In other embodiments, coverage ranges of the first organic polymer layer 10 and the second organic polymer layer 20 may be adjusted.

Figure 5A:
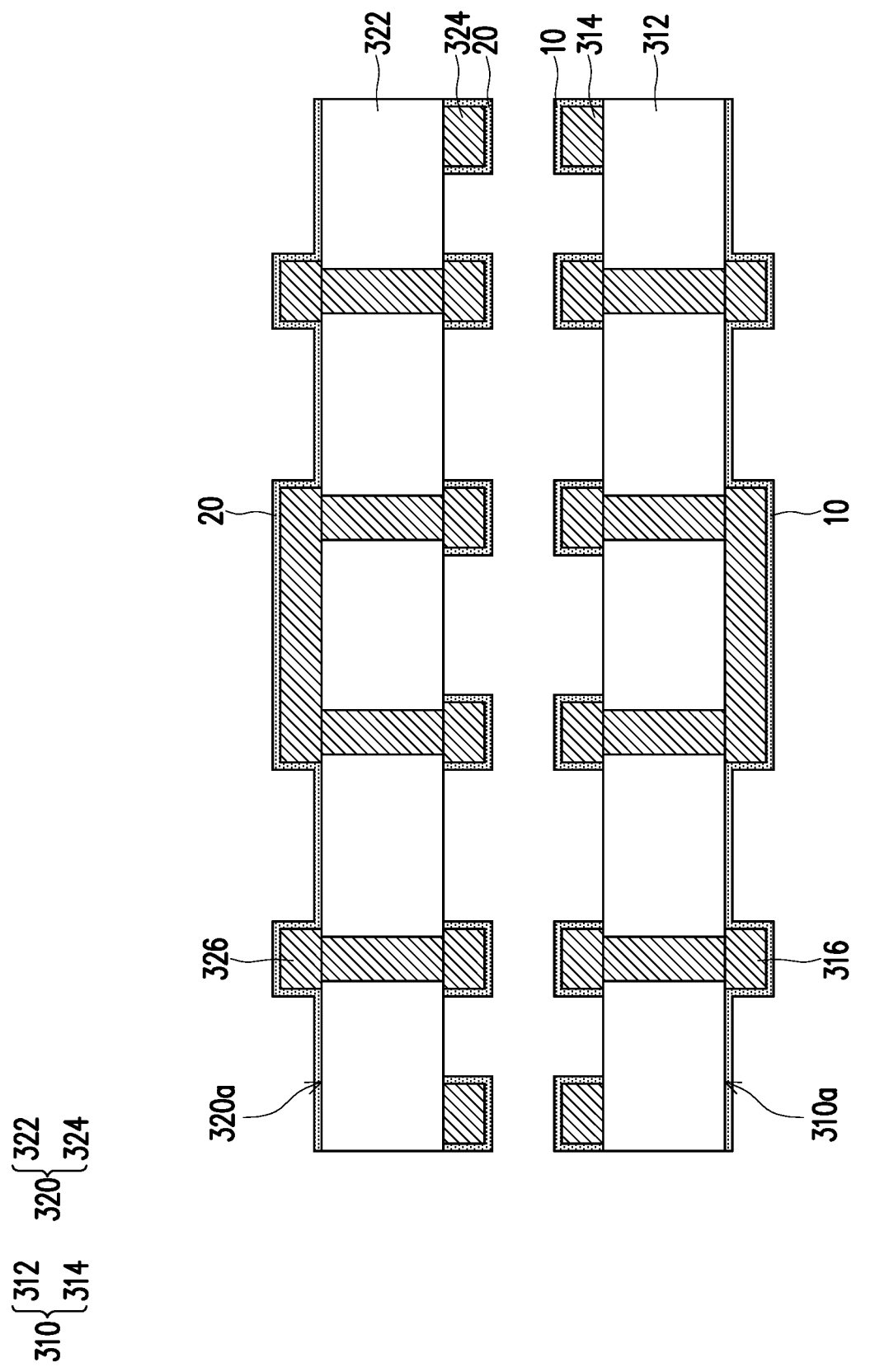
FIG. 5A to FIG. 5C are partial cross-sectional schematic views of part of a fabrication method of an electronic device bonding structure according to still yet another embodiment of the disclosure.
Figure 5B:
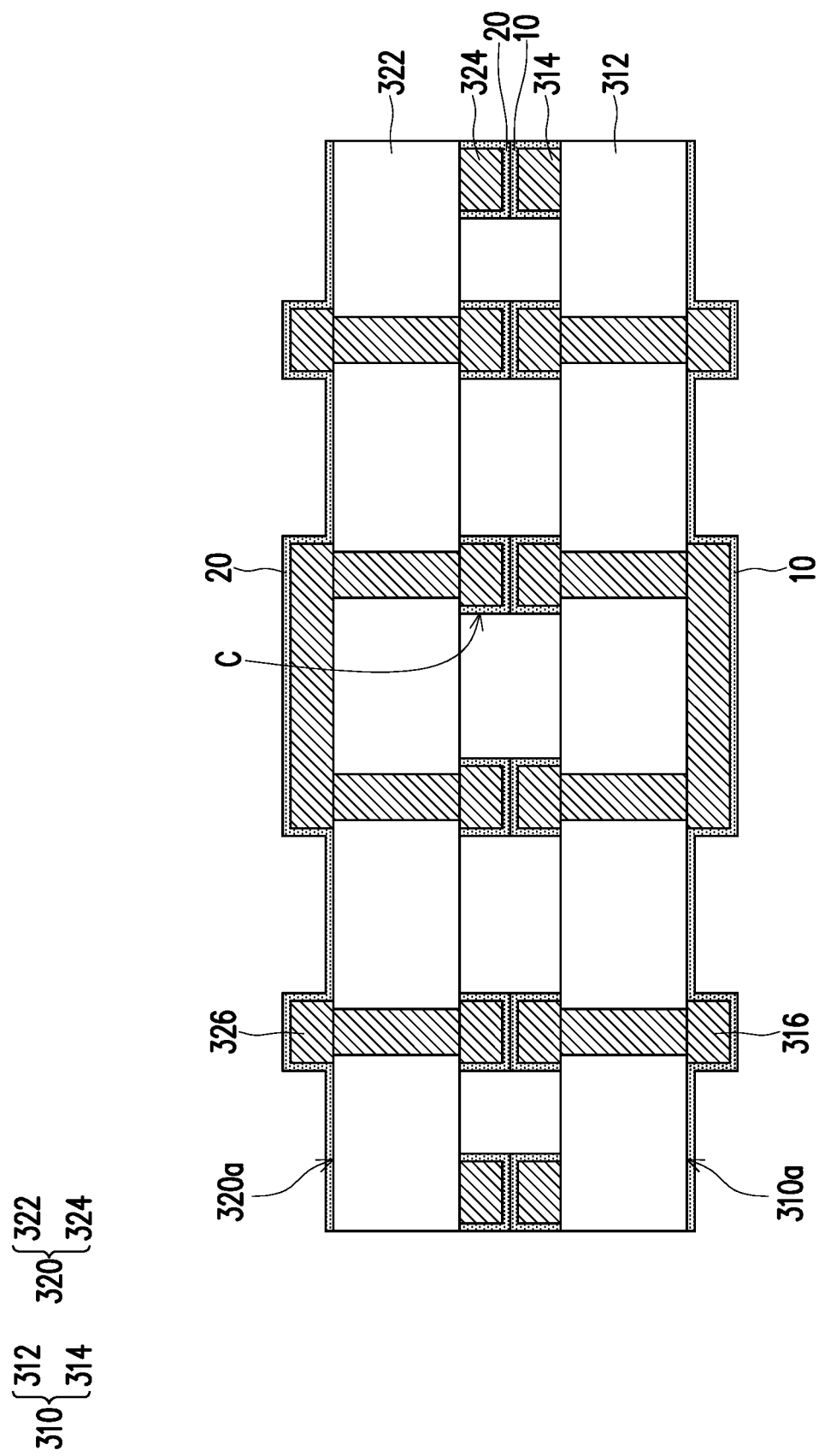
Figure 5C:
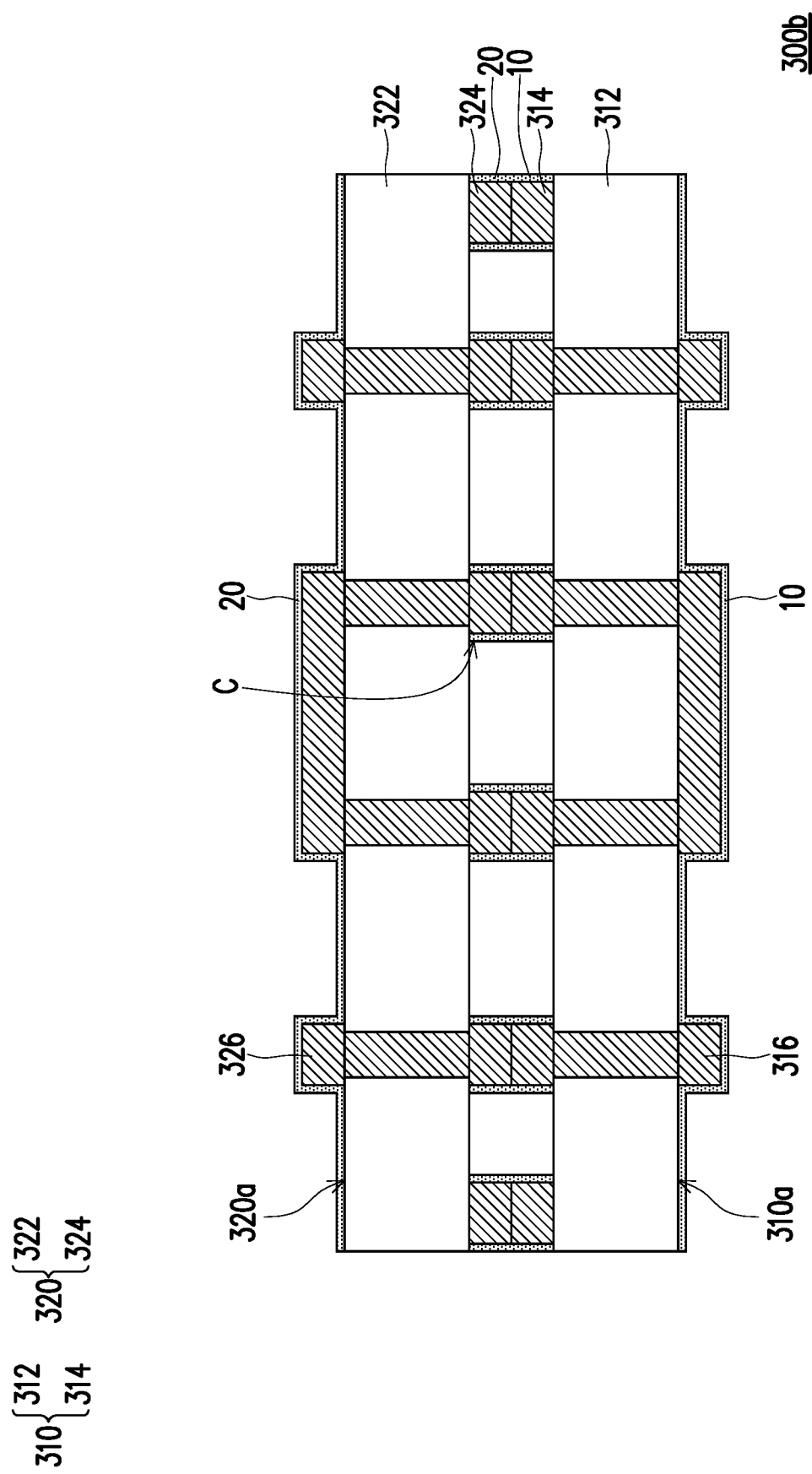

FIG. 5A to FIG. 5C are partial cross-sectional schematic views of part of a fabrication method of an electronic device bonding structure according to still yet another embodiment of the disclosure. An electronic device bonding structure 300b provided in FIG. 5A to FIG. 5C is similar to that provided in FIG. 4A to FIG. 4C, but a difference therebetween lies in that the first organic polymer layer 10 may completely cover the surface 310a of the first electronic component 310 opposite to the first conductive bonding portion 314, and the second organic polymer layer 20 may completely cover the surface 320a of second electronic component 320 opposite to the second conductive bonding portion 324. In the present embodiment, the first organic polymer layer 10 may cover the first substrate 312 of the first electronic component 310, and the second organic polymer layer 20 may cover the second substrate 322 of the second electronic component 320.

Note that the disclosure is not limited to the circuit substrate types provided in the foregoing embodiments, circuit substrates having conductive bonding portions for mutual bonding all belong to the protection scope of the disclosure.

In view of the foregoing, in the disclosure, the organic polymer layers are formed on the conductive bonding portions of the electronic components to be bonded. In this way, the organic polymer layers may protect the conductive bonding portions on the electronic components, such that the oxidation problem which occurs on the bonding surface is effectively improved. In addition, the organic polymer layers may diffuse into the conductive bonding portions as affected by the bonding, a new compound is thereby formed in the conductive bonding portions, and the die microstructure thus changes. A columnar micro structure is changed to an improved refinement die distribution structure, such that the die microstructure in the conductive bonding portions is enhanced, and the bonding strength is improved. As such, in the electronic device bonding structure and the fabrication method thereof provided by the disclosure, the oxidation problem which occurs on the bonding surface may be effectively improved, the bonding strength is also enhanced, and favorable product quality is therefore provided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device bonding structure, comprising:
   a first electronic component, comprising a first conductive bonding portion;
   a second electronic component, comprising a second conductive bonding portion;
   a first organic polymer layer, located on a side wall of the first conductive bonding portion; and
   a second organic polymer layer, located on a side wall of the second conductive bonding portion, wherein:
   the second conductive bonding portion is bonded to the first conductive bonding portion, such that the first electronic component and the second electronic component are electrically connected, and
   dies in the first conductive bonding portion and dies in the second conductive bonding portion have a refinement die distribution structure.

2. The electronic device bonding structure according to claim 1, wherein the refinement die distribution structure is a structure in which sizes of part of the dies in the first conductive bonding portion and the second conductive bonding portion close to a bonding junction of the first conductive bonding portion and the second conductive bonding portion are less than sizes of part of the dies away from the bonding junction of the first conductive bonding portion and the second conductive bonding portion.

3. The electronic device bonding structure according to claim 1, wherein the first electronic component and the second electronic component comprise wafer-to-wafer bonding or circuit substrate-to-circuit substrate bonding.

4. The electronic device bonding structure according to claim 1, wherein the first conductive bonding portion and the second conductive bonding portion respectively are a conductive bump and a conductive pad.

5. The electronic device bonding structure according to claim 1, wherein a plurality of the first conductive bonding portions and a plurality of the second conductive bonding portions are provided, and a cavity is formed between adjacent first conductive bonding portions and between adjacent second conductive bonding portions.

6. The electronic device bonding structure according to claim 5, wherein the cavity does not have an underfill.

7. The electronic device bonding structure according to claim 1, wherein the first conductive bonding portion directly contacts the second conductive bonding portion.

8. The electronic device bonding structure according to claim 1, wherein:
   the first organic polymer layer is further located on a surface of the first electronic component opposite to the first conductive bonding portion; and
   the second organic polymer layer is further located on a surface of the second electronic component opposite to the second conductive bonding portion.

\* \* \* \* \*